(12) United States Patent
Wu et al.

(10) Patent No.: US 9,799,394 B2
(45) Date of Patent: Oct. 24, 2017

(54) STATIC RANDOM ACCESS MEMORY (SRAM) WITH RECOVERY CIRCUIT FOR A WRITE OPERATION

(71) Applicant: TAIWAN SEMICONDUCTOR MANUFACTURING COMPANY, LTD., Hsinchu (TW)

(72) Inventors: Wei-Cheng Wu, Hsinchu (TW); Kao-Cheng Lin, Taipei (TW); Wei Min Chan, Sindian (TW); Yen-Huei Chen, Jhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/696,795

(22) Filed: Apr. 27, 2015

(65) Prior Publication Data
US 2016/0293248 A1    Oct. 6, 2016

Related U.S. Application Data

(60) Provisional application No. 62/139,892, filed on Mar. 30, 2015.

(51) Int. Cl.
*G11C 11/419* (2006.01)

(52) U.S. Cl.
CPC ................. *G11C 11/419* (2013.01)

(58) Field of Classification Search
CPC .... G11C 11/419; G11C 11/413; G11C 7/1096
See application file for complete search history.

(56) References Cited

U.S. PATENT DOCUMENTS

| 8,120,975 | B2 * | 2/2012 | Kenkare ............... G11C 11/419 365/154 |
| 8,605,523 | B2 | 12/2013 | Tao et al. |
| 8,630,132 | B2 | 1/2014 | Cheng et al. |
| 8,760,948 | B2 | 6/2014 | Tao et al. |
| 9,177,633 | B2 * | 11/2015 | Roy ..................... G11C 11/4096 |
| 9,324,392 | B1 * | 4/2016 | Asenov .................... G11C 7/12 |
| 9,349,437 | B2 * | 5/2016 | Singh .................... G11C 11/419 |
| 9,378,788 | B2 * | 6/2016 | Kolar ........................ G11C 7/12 |
| 2014/0032871 | A1 | 1/2014 | Hsu et al. |
| 2014/0112062 | A1 * | 4/2014 | Trivedi .................. G11C 11/419 365/154 |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |

* cited by examiner

*Primary Examiner* — Andrew Q Tran
(74) *Attorney, Agent, or Firm* — Hauptman Ham, LLP

(57) ABSTRACT

A static random access memory (SRAM) including at least a memory cell array, a first data line, a second data line, a third data line and a driver circuit. The first data line is electrically coupled with the memory cell array. The second data line is electrically coupled with the memory cell array. The driver circuit is electrically coupled with the first data line, the second data line and the third data line. The driver circuit includes a recovery circuit electrically coupled with the first data line, the second data line and the third data line. During a write operation of the SRAM, the recovery circuit is configured to pull a voltage level of the first data line to a first voltage level when the recovery circuit is enabled.

20 Claims, 10 Drawing Sheets

STATIC RANDOM ACCESS MEMORY (SRAM) WITH RECOVERY CIRCUIT FOR A WRITE OPERATION

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, operating voltages continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
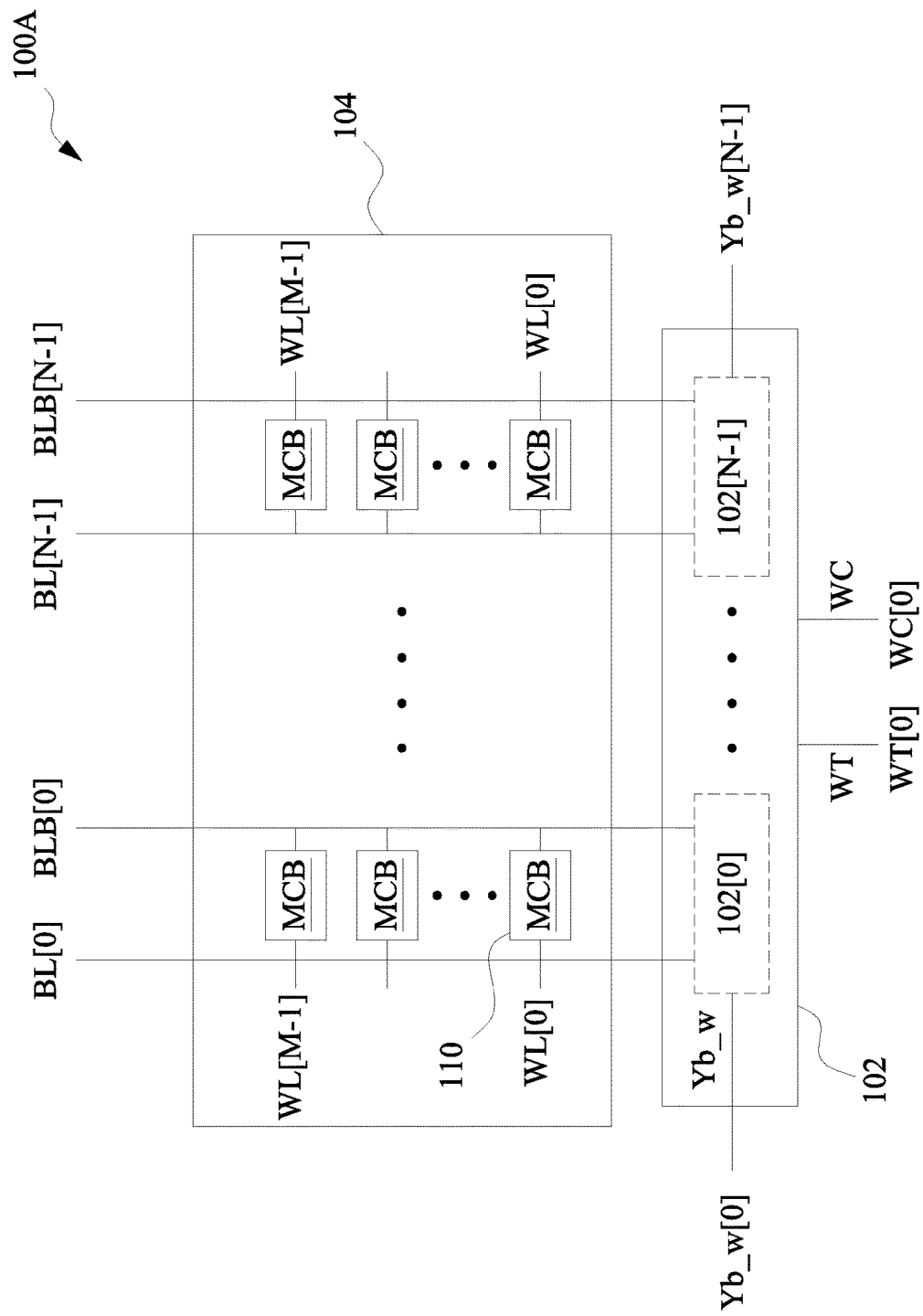
FIG. 1A is a block diagram of a representative portion of a memory circuit in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) including at least a memory cell array, a first data line electrically coupled with the memory cell array, a second data line electrically coupled with the memory cell array, a third data line and a driver circuit electrically coupled with the first data line, the second data line and the third data line. The driver circuit includes a recovery circuit electrically coupled with the first data line, the second data line and the third data line. During a write operation of the SRAM, the recovery circuit is configured to pull a voltage level of the first data line to a first voltage level. In some embodiments, the recovery circuit assists the SRAM from recovering from a dummy read. In some embodiments, the recovery circuit improves the logical high level of the bit line or the bit line bar such that the SRAM recovers from a dummy read and the high side driving strength of driver circuit is improved (during a write operation of the SRAM). In some embodiments, the recovery circuit improves the logical low level of the bit line or the bit line bar such that the low side driving strength of the driver circuit is improved (during a write operation of the SRAM).

FIG. 1A is a block diagram of a representative portion of a memory circuit 100A in accordance with one or more embodiments. Memory circuit 100A includes a driver array 102 and a memory cell array 104.

Memory circuit 100 also includes M word lines WL[0], . . . WL[M−1], N bit lines BL[0], . . . BL[N−1], N bit line bars BLB[0], . . . BLB[N−1], N data lines WC[0], . . . WC[N−1], and N data line bars WT[0], . . . WT[N−1], where M is an integer corresponding to the number of rows in memory cell array 104 and N is an integer corresponding to the number of columns in memory cell array 104. Note that the term "bar" as used in this context indicates a logically inverted signal, for example, bit line bar BLB[0], . . . BLB[N−1] carries a signal logically inverted from a signal carried by bit line BL[0], . . . BL[N−1].

Driver array 102 is electrically coupled with memory cell array 104 by bit lines BL[0], . . . BL[N−1] and bit line bars BLB[0], . . . BLB[N−1]. Memory cell array 104 is electrically coupled with driver array 102 by bit lines BL[0], . . . BL[N−1] and bit line bars BLB[0], . . . BLB[N−1].

Driver array 102 is configured to control memory cell array 104. Driver array 102 comprises an array of driver circuits 102[0], . . . , 102[N−1], where N is an integer corresponding to the number of columns in memory cell array 104. Each driver circuit 102[0], . . . , 102[N−1] is electrically coupled with a corresponding bit line BL[0], . . . , BL[N−1], a corresponding bit line bar BLB[0], . . . , BLB[N−1], and a corresponding driver control line Yb_w[0], . . . Yb_w[N−1]. Each driver circuit 102[0], . . . , 102[N−1] is electrically coupled with a corresponding column of memory cells in memory cell array 104 by a corresponding bit line BL[0], . . . BL[N−1] and bit line bar BLB[0], . . . , BLB[N−1]. Driver circuits 102[0], . . . , 102[N−1] of Driver array 102 are configured to receive a first data signal WT on data line WT[0] or a second data signal WC on data line WC[0]. In some embodiments, the first data signal WT is, e.g., a logical low level or a logical high level. In some embodiments, the second data signal WC is, e.g., a logical low level or a logical high level. Driver array 102 is configured to receive control signals (collectively labeled as "Yb_w") on driver control line Yb_w[0], . . . Yb_w [N−1]. In some embodiments, each driver control signal on the corresponding driver control line Yb_w[0], . . . Yb_w [N−1] is, e.g., a logical low level or a logical high level.

Driver array 102 is configured to control a voltage level BL/BLB on one of the bit lines BL[0], . . . BL[N−1] or bit line bars BLB[0], . . . , BLB[N−1] for various operations of memory circuit 100. In some embodiments, during a write operation, driver array 102 is configured to write data into memory cell array 104 by bit line BL[0], . . . , BL[N−1] and bit line bar BLB[0], . . . BLB[N−1]. In some embodiments, driver array 102 is configured to generate a voltage signal (e.g., BL) on bit line BL[0], . . . , BL[N−1] and a voltage signal (e.g., BLB) on bit line bar BLB[0], . . . BLB[N−1] for controlling memory cell array 104.

In some embodiments, during a write operation, one of the driver circuits 102[0], . . . , 102[N−1] is configured to control a voltage on the corresponding bit line BL[0], . . . , BL[N−1] or bit line bar BLB[0], . . . , BLB[N−1]. In some embodiments, during a write operation, one of the driver circuits 102[0], . . . , 102[N−1] is configured to write data into memory cell array 104 by bit line BL[0], . . . , BL[N−1] and bit line bar BLB[0], . . . BLB[N−1]. In some embodiments, one of the driver circuits 102[0], . . . , 102[N−1] is configured to generate a voltage signal (e.g., bit line signal BL) on bit line BL[0], . . . , BL[N−1] or a voltage signal (e.g., bit line bar signal BLB) on bit line bar BLB[0], . . . BLB[N−1] for controlling memory cell array 104. In some embodiments, the bit line signal BL is, e.g., a logical low level or a logical high level. In some embodiments, the bit line bar signal BLB is, e.g., a logical low level or a logical high level. In some embodiments, one or more driver circuits 102[0], . . . , 102[N−1] are functionally equivalent to the other driver circuits 102[0] . . . , 102[N−1] in driver array 102.

One or more driver circuits 102[0], . . . , 102[N−1] are configured to receive a first data signal WT on data line WT[0] or a second data signal WC on data line WC[0]. One or more driver circuits 102[0], . . . , 102[N−1] are configured to receive a corresponding driver control signal Yb_w on the corresponding driver control line Yb_w[0], . . . or Yb_w [N−1]. In some embodiments, the driver control signal Yb_w is an enable/disable signal which selectively turns on/off (e.g., activates/deactivates) one or more driver circuits 102[0], . . . , 102[N−1]. In some embodiments, the driver control signal Yb_w activates the corresponding one or more driver circuits 102[0], . . . , 102[N−1] if the first driver control signal Yb_w transitions from a logical high level to a logical low level. In some embodiments, the first driver control signal Yb_w deactivates the corresponding one or more driver circuits 102[0], . . . , 110[N−1] if the first driver control signal Yb_w transitions from a logical low level to a logical high level.

One or more driver circuits 102[0], . . . , 102[N−1] are configured to control a voltage level BL/BLB on one of the bit lines BL[0], . . . BL[N−1] or bit line bars BLB[0], . . . , BLB[N−1] for various operations of memory circuit 100. In some embodiments, one or more driver circuits 102[0], . . . , 102[N−1] are configured to adjust or pull a voltage level on a corresponding bit line BL[0], . . . BL[N−1] or bit line bar BLB[0], . . . BLB[N−1] toward a first voltage level during a write operation of memory circuit 100 when the corresponding one or more driver circuits 102[0], . . . , 102[N−1] is activated. In some embodiments, the first voltage level is less than a voltage source VDD. In some embodiments, the first voltage level is substantially equal to a ground voltage VSS. In some embodiments, the first voltage level is greater than a ground voltage VSS. In some embodiments, the first voltage level is substantially equal to a voltage source VDD. In some embodiments, one or more driver circuits 102[0], . . . , 102[N−1] are configured to perform an equivalent function.

One data line WT[0] carries a data signal (e.g., first data signal WT) for a selected column of memory cells in memory cell array 104 and a selected driver circuit (e.g., one of driver circuits 102[0], . . . , 102[N−1]) in driver array 102. One data line WC[0] carries a data signal (e.g., second data signal WC) for the selected column of memory cells in memory cell array 104 and a selected driver circuit (e.g., one of driver circuits 102[0], . . . , 102[N−1]) in driver array 102.

N driver control lines Yb_w[0], . . . Yb_w[N−1] carry N driver control signals (e.g., collectively driver control signals Yb_w) to activate corresponding driver circuits 102[0], . . . , 102[N−1] in the driver array 102, where N is an integer corresponding to the number of columns in memory cell array 104. For example, driver control line Yb_w [0] is electrically coupled with driver circuit 102[0]. For example, driver control line Yb_w [N−1] is electrically coupled with driver circuit 102[N−1]. In some embodiments, driver control lines Yb_w[0], . . . Yb_w[N−1] are referred to as column select lines.

Memory cell array 104 includes an array of memory cells MCB including M rows by N columns, where M is an integer corresponding to the number of rows and N is an integer corresponding to the number of columns. In some embodiments, memory cell array 104 includes one or more single port (SP) static random access memory (SRAM) cells MCB. In some embodiments, memory cell array 104 includes one or more dual port (DP) SRAM cells MCB. Memory cell 110 is a single memory cell of the array of memory cells MCB of memory cell array 104.

M word lines WL[0], . . . WL[M−1] carry word line signals to activate corresponding rows of memory cells in the memory cell array 104, where M is an integer corresponding to the number of rows in memory cell array 104. Word line WL[0] is electrically coupled with each of the memory cells MCB that form row 0 of the memory cell array 104. Word line WL[M−1] is electrically coupled with each of the memory cells MCB that form row M−1 of the memory cell array 104.

N bit lines BL[0], . . . BL[N−1] carry data signals in a selected column of memory cells in memory cell array 104, where N is an integer corresponding to the number of columns in memory cell array 104. Bit line BL[0] is electrically coupled with each of the memory cells MCB that form column 0 of memory cell array 104. Bit line BL[N−1] is electrically coupled with each of the memory cells MCB that form column N−1 of memory cell array 104. Each of the bit lines BL[0], . . . BL[N−1] is electrically coupled with a corresponding driver circuit 102[0], . . . , 102[N−1] in driver array 102.

N bit line bars BLB[0], . . . , BLB[N−1] carry data signals in the selected column of memory cells in memory cell array 104. Bit line bar BLB[0] is electrically coupled with each of the memory cells MCB that form column 0 of memory cell array 104. Bit line bar BLB[N−1] is electrically coupled with each of the memory cells MCB that form column N−1 of memory cell array 104. Each of the bit line bars BLB[0], . . . BLB[N−1] is electrically coupled with a corresponding driver circuit 102[0], . . . , 102[N−1] in driver array 102.

In some embodiments, a memory circuit includes a plurality replications of memory circuit 100A, where each replication of memory circuit 100A is electrically coupled with a different pair of data lines WT[0]/WC[0] . . . WT[A−1]/WC[A−1]. A is the number of replications of memory circuit 100A and is a positive integer.

Figure 1B:
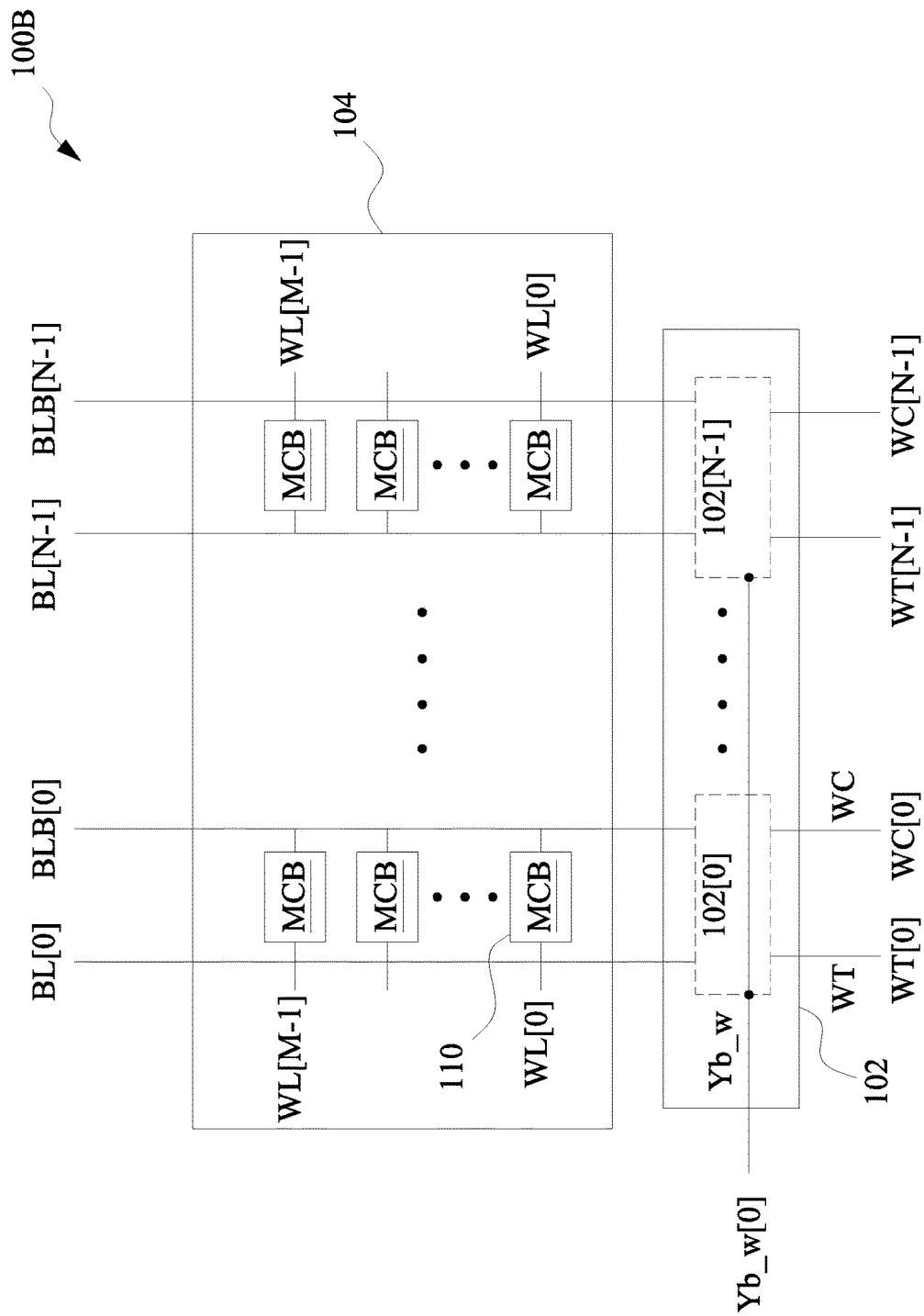
FIG. 1B is a block diagram of a representative portion of another memory circuit in accordance with one or more embodiments.

FIG. 1B is a block diagram of a representative portion of a memory circuit 100B in accordance with one or more embodiments. Components that are the same or similar to those in FIG. 1A are given the same reference numbers, and detailed description thereof is thus omitted.

Compared with memory circuit 100A, each driver circuit 102[0], . . . , 102[N−1] in memory circuit 100B is electrically coupled with a corresponding a corresponding data line WC[0], . . . WC[N−1], and a corresponding data line WT[0], . . . WT[N−1]. Also, driver circuits 102[0], . . . , 102[N−1] are all electrically coupled with the same driver control line Yb_w[0]. In some embodiments, a memory circuit includes a plurality replications of memory circuit 100B, where each replication of memory circuit 100B is electrically coupled with a different driver control line Yb_w[0] . . . Yb_w[B−1]. B is the number of replications of memory circuit 100B and is a positive integer.

Figure 2A:
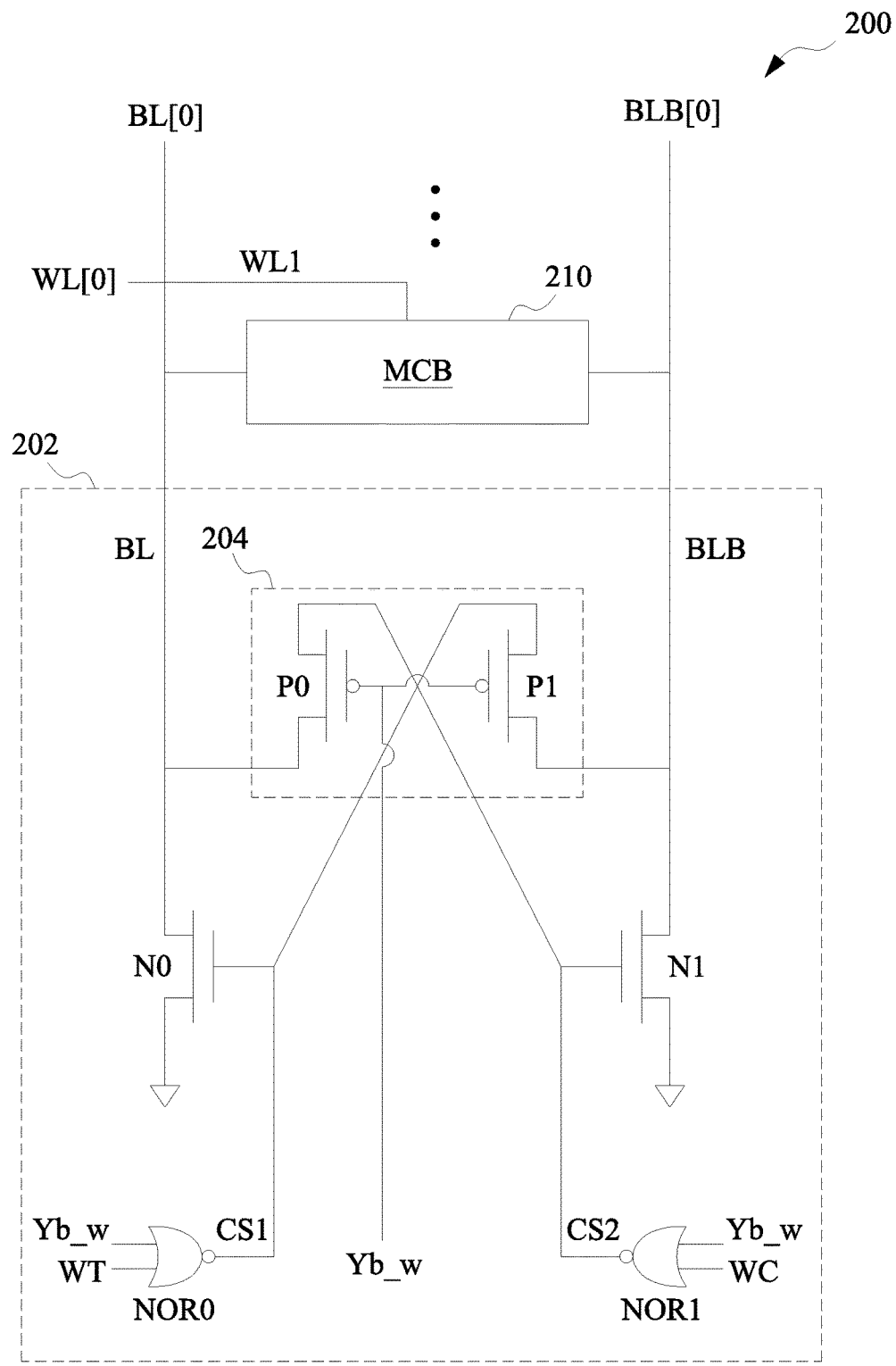
FIG. 2A is a schematic diagram of a driver circuit in a memory circuit in accordance with one or more embodiments.

FIG. 2A is a schematic diagram of a driver circuit 202 in a memory circuit 200 in accordance with one or more embodiments. Memory circuit 200 is an embodiment of memory circuit 100A shown in FIG. 1A or an embodiment of memory circuit 100B shown in FIG. 1B.

Memory circuit 200 comprises driver circuit 202, a memory cell 210, a bit line BL [0], a bit line bar BLB [0] and a word line WL[0]. Driver circuit 202 is an embodiment of driver circuit 102[0] shown in FIG. 1. Memory cell 210 is an embodiment of memory cell 110 shown in FIG. 1.

Driver circuit 202 comprises NOR gates NOR0 and NOR1, n-type metal oxide semiconductor (NMOS) transistors N0 and N1 and a recovery circuit 204.

NOR gate NOR0 is electrically coupled with a gate of NMOS transistor N0 and recovery circuit 204. NOR gate NOR0 has a first input terminal configured to receive a driver control signal Yb_w and a second input terminal configured to receive a first data signal WT. NOR gate NOR0 is configured to output a first control signal CS1 at an output terminal to NMOS transistor N0 and recovery circuit 204. In some embodiments, if driver control signal Yb_w is a logical low level, first control signal CS1 is an inverted version of first data signal WT. In some embodiments, first control signal CS1 is, e.g., a logical low level or a logical high level.

NOR gate NOR1 is electrically coupled with a gate of NMOS transistor N1 and recovery circuit 204. NOR gate NOR1 has a first input terminal configured to receive a first driver control signal Yb_w and a second input terminal configured to receive a second data signal WC. NOR gate NOR1 is configured to output a second control signal CS2 at an output terminal to NMOS transistor N1 and recovery circuit 204. In some embodiments, if driver control signal Yb_w is a logical low level, second control signal CS2 is an inverted version of second data signal WC. In some embodiments, second control signal CS2 is, e.g., a logical low level or a logical high level.

NMOS transistor N0 has a source terminal electrically coupled with a reference node, a drain terminal electrically coupled with bit line BL, and a gate terminal electrically coupled with the output terminal of NOR gate NOR0. In some embodiments, the gate terminal of NMOS transistor N0 is also referred to as a control terminal of NMOS transistor N0. The reference node is configured to carry a reference voltage, such as a voltage VSS or a ground voltage. NMOS transistor N0 is configured to electrically couple bit line BL[0] to the reference voltage. In some embodiments, if NMOS transistor N0 is activated (e.g., switched-on), NMOS transistor N0 is configured to pull a voltage level of bit line BL[0] to the reference voltage. In some embodiments, the reference voltage has a voltage level corresponding to a logical low level.

NMOS transistor N1 has a source terminal electrically coupled with the reference node, a drain terminal electrically coupled with bit line BLB, and a gate terminal electrically coupled with the output terminal of NOR gate NOR1. In some embodiments, the gate terminal of NMOS transistor N1 is also referred to as a control terminal of NMOS transistor N1. NMOS transistor N1 is configured to electrically couple bit line bar BLB[0] to the reference voltage. In some embodiments, if NMOS transistor N1 is activated (e.g., switched-on), NMOS transistor N1 is configured to pull a voltage level of bit line bar BLB[0] to the reference voltage that corresponds to a logical low level.

Recovery circuit 204 is configured to receive first driver control signal Yb_w. Recovery circuit 204 is configured to control a voltage of bit line BL[0] or bit line bar BLB[0]. In some embodiments, recovery circuit 204 is configured to selectively adjust the voltage of bit line BL[0] or bit line bar BLB[0]. In some embodiments, recovery circuit 204 assists memory circuit 200 from recovering from a dummy read. In some embodiments, recovery circuit 204 improves the logical high level of bit line BL[0] or bit line bar BL[0] such that memory circuit 200 recovers from a dummy read and the high side driving strength of driver circuit 202 is improved. In some embodiments, recovery circuit 204 improves the logical low level of bit line BL[0] or bit line bar BLB[0] such that the low side driving strength of driver circuit 202 is improved.

Recovery circuit 204 is electrically coupled with the gate and drain of NMOS transistor N0, the gate and drain of NMOS transistor N1, the output terminal of NOR gate NOR0, the output terminal of NOR gate NOR1, memory cell 210, bit line BL[0], bit line bar BLB[0], word line WL[0] and driver control signal Yb_w.

Recovery circuit 204 comprises p-type metal oxide semiconductor (PMOS) transistors P0 and P1.

A gate terminal of PMOS transistor P0 is electrically coupled with a gate terminal of PMOS transistor P1 and configured to receive driver control signal Yb_w. In some embodiments, gate terminal of PMOS transistor P0 is also referred to as a control terminal of PMOS transistor P0, and gate terminal of PMOS transistor P1 is also referred to as a control terminal of PMOS transistor P1. A source terminal of PMOS transistor P0 is electrically coupled with the gate terminal of NMOS transistor N1 and the output terminal of NOR gate NOR1. A drain terminal of PMOS transistor P0 is electrically coupled with memory cell 210 and the drain terminal of NMOS transistor N0 by bit line BL[0]. Both PMOS transistor P0 and P1 are configured to be activated (e.g., switched-on) or deactivated (e.g., switched-off) based on driver control signal Yb_w. In some embodiments, current fighting is prevented in a read operation by deactivating (e.g., switching-off) PMOS transistors P0 and P1 by driver control signal Yb_w.

PMOS transistor P0 is configured to electrically couple bit line BL[0] to the gate of NMOS transistor N1 and the output terminal of NOR gate NOR1. PMOS transistor P0 is configured to control the voltage of bit line BL[0]. In some embodiments, PMOS transistor P0 is configured to selectively adjust the voltage of bit line BL[0] toward a voltage of second control signal CS2. In some embodiments, PMOS transistor P0 is configured to pull the voltage of bit line BL[0] to a logical low level. In some embodiments, PMOS transistor P0 is configured to pull the voltage of bit line BL[0] to a logical high level.

In some embodiments, if second control signal CS2 is a logical high level, PMOS transistor P0 is configured to provide a logical high level to bit line BL[0]. In some embodiments, if second control signal CS2 is a logical high level and PMOS transistor P0 is activated (e.g., switched-on), PMOS transistor P0 improves the logical high level of bit line BL[0] such that memory circuit 200 recovers from a dummy read, and the high side driving strength of driver circuit 202 is improved.

In some embodiments, if second control signal CS2 is a logical low level, PMOS transistor P0 is configured to provide a logical low level to bit line BL[0]. In some embodiments, if second control signal CS2 is a logical low level and PMOS transistor P0 is activated (e.g., switched-on), PMOS transistor P0 improves the logical low level of bit line BL[0] such that the low side driving strength of driver circuit 202 is improved.

A gate terminal of PMOS transistor P1 is electrically coupled with a gate terminal of PMOS transistor P0 and configured to receive driver control signal Yb_w. A source terminal of PMOS transistor P1 is electrically coupled with the gate terminal of NMOS transistor N0 and the output terminal of NOR gate NOR0. A drain terminal of PMOS transistor P1 is electrically coupled with memory cell 210 and the drain terminal of NMOS transistor N1 by bit line bar BLB[0].

PMOS transistor P1 is configured to electrically couple bit line bar BLB[0] to the gate terminal of NMOS transistor N0 and the output terminal of NOR gate NOR0. PMOS transistor P1 is configured to control the voltage of bit line bar BLB[0]. In some embodiments, PMOS transistor P1 is configured to selectively adjust the voltage of bit line bar BLB[0] toward a voltage of first control signal CS1. In some embodiments, PMOS transistor P1 is configured to pull the voltage of bit line bar BLB[0] to a logical low level. In some embodiments, PMOS transistor P1 is configured to pull the voltage of bit line bar BLB[0] to a logical high level.

In some embodiments, if first control signal CS1 is a logical high level, PMOS transistor P1 is configured to provide a logical high level to bit line bar BLB[0]. In some embodiments, if first control signal CS1 is a logical high level and PMOS transistor P1 is activated (e.g., switched-on), PMOS transistor P1 improves the logical high level of bit line bar BLB[0] such that memory circuit 200 recovers from a dummy read and the high side driving strength of driver circuit 202 is improved.

In some embodiments, if first control signal CS1 is a logical low level, PMOS transistor P1 is configured to provide a logical low level to bit line bar BLB[0]. In some embodiments, if first control signal CS1 is a logical low level and PMOS transistor P1 is activated (e.g., switched-on), PMOS transistor P1 improves the logical low level of bit line bar BLB[0] such that the low side driving strength of driver circuit 202 is improved.

Memory cell 210 is electrically coupled with the drain of NMOS transistor N0 and N1, bit line BL[0], bit line bar BLB[0] and word line WL[0].

Figure 2B:
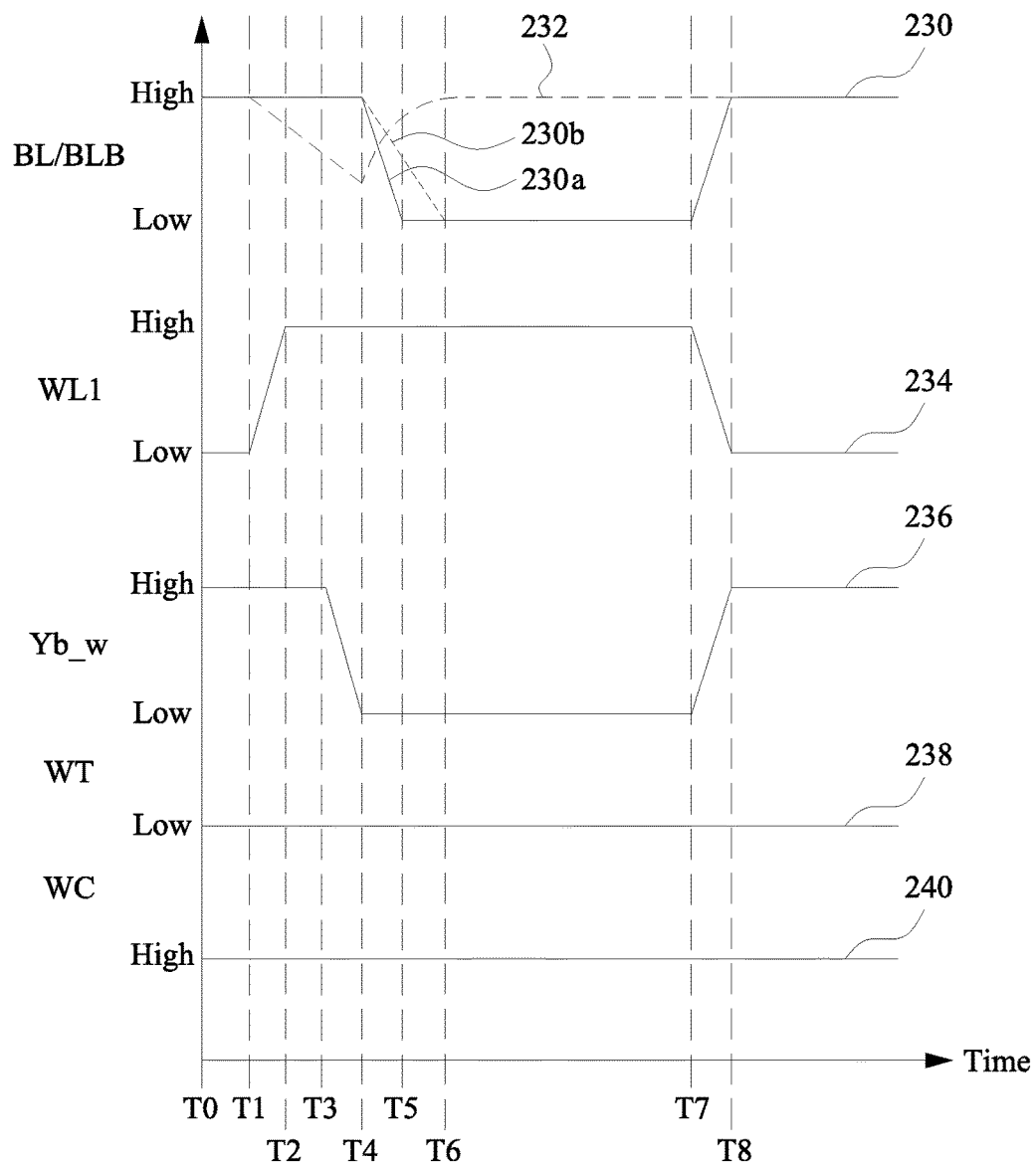
FIG. 2B shows waveforms of various signals when a write operation is performed on a memory circuit depicted in FIG. 2A.

FIG. 2B shows waveforms of various signals when a write operation is performed on memory circuit 200.

Curve 230 represents the bit line signal BL; curve 230a represents a portion of the bit line signal BL; curve 230b represents a portion of the bit line signal BL according to a different ocnfiguration; curve 232 represents the bit line bar signal BLB; curve 234 represents the word line signal WL1; curve 236 represents the driver control signal Yb_w; curve 238 represents the first data signal WT; and curve 240 represents the second data signal WC.

Curve 230a represents an embodiment of curve 230 (e.g., bit line signal BL) from time T4 to T5 if the recovery circuit 204 is utilized with driver circuit 202. Curve 230b represents a portion of the bit line signal BL from time T4 to T6 if the recovery circuit 204 is not utilized with driver circuit 202.

At time T0, curve 238 (e.g., first data signal WT) is a logical low level. At time T0, curve 240 (e.g., second data signal WC) is a logical high level.

At time T1, curve 234 (e.g., word line signal WL1) starts transitioning from a logical low level to a logical high level. At time T1, curve 232 (e.g., bit line bar signal BLB) starts transitioning from a logical high level to a logical low level. In some embodiments, curve 232 (e.g., bit line bar signal BLB) starts transitioning from a logical high level to a logical low level from a dummy read or leakage of the bit line bar BLB[0] shown in FIG. 2A.

At time T2, curve 234 (e.g., word line signal WL1) finishes transitioning from a logical low level to a logical high level.

At time T3, curve 236 (e.g., driver control signal Yb_w) starts transitioning from a logical high level to a logical low level.

At time T4, curve 236 (e.g., driver control signal Yb_w) finishes transitioning from a logical high level to a logical low level. At time T4, curve 230 (e.g., bit line signal BL) starts transitioning from a logical high level to a logical low level. At time T4, curve 232 (e.g., bit line bar signal BLB) stops transitioning to a logical low level and starts transitioning to a logical high level.

In some embodiments, if curve 236 (e.g., driver control signal Yb_w) transitions to a logical low level, recovery circuit 204 is enabled (e.g., activated). In some embodiments, if curve 236 (e.g., driver control signal Yb_w) transitions to a logical low level, PMOS transistors P0 and P1 shown in FIG. 2A are activated (e.g., switched-on), curve 232 (e.g., bit line bar signal BLB) is pulled to a logical high level and curve 230 (e.g., bit line signal BL) is pulled to a logical low level. In some embodiments, if curve 232 (e.g., bit line bar signal BLB) is pulled to a logical high level, memory circuit 200 (shown in FIG. 2A) is configured to recover from a dummy read and the high side driving strength of driver circuit 202 is improved. In some embodiments, if curve 230 (e.g., bit line signal BL) is pulled to a logical low level, the low side driving strength of driver circuit 202 (shown in FIG. 2A) is improved.

At time T5, curve 230 (e.g., bit line signal BL) finishes transitioning from a logical high level to a logical low level.

At time T6, curve 232 (e.g., bit line bar signal BLB) finishes transitioning to a logical high level. In some embodiments, memory circuit 200 recovers from a dummy read since after time T6 curve 232 (e.g., bit line bar signal BLB) transitions to a logical high level.

At time T7, curve 230 (e.g., bit line signal BL) starts transitioning from a logical low level to a logical high level. At time T7, curve 234 (e.g., word line signal WL1) starts transitioning from a logical high level to a logical low level. At time T7, curve 236 (e.g., driver control signal Yb_w) starts transitioning from a logical low level to a logical high level.

At time T8, curve 230 (e.g., bit line signal BL) finishes transitioning from a logical low level to a logical high level. At time T8, curve 234 (e.g., word line signal WL1) finishes transitioning from a logical high level to a logical low level. At time T8, curve 236 (e.g., driver control signal Yb_w) finishes transitioning from a logical low level to a logical high level.

In some embodiments, if recovery circuit 204 is utilized by driver circuit 202, the bit line signal BL (e.g., curve 230a) transitions faster to a logical low level than if a recovery circuit is not utilized by a driver circuit (e.g., curve 230b).

In FIG. 2B, bit line signal BL, bit line bar signal BLB, first data signal WT, second data signal WC, and driver control signal Yb_w, and their corresponding logical levels are illustrated as an example. The operation of these signals with various logical levels are within the contemplation of a person of ordinary skill in the art. Recovery circuit 204 assists pulling bit line bar signal BLB to the logical low level and recovering bit line signal BL to the logical high level in a manner similar to that for assists pulling bit line signal BL to the logical low level and recovering bit line bar signal BLB to the logical high level illustrated in conjunction with FIG. 2B.

Figure 3:
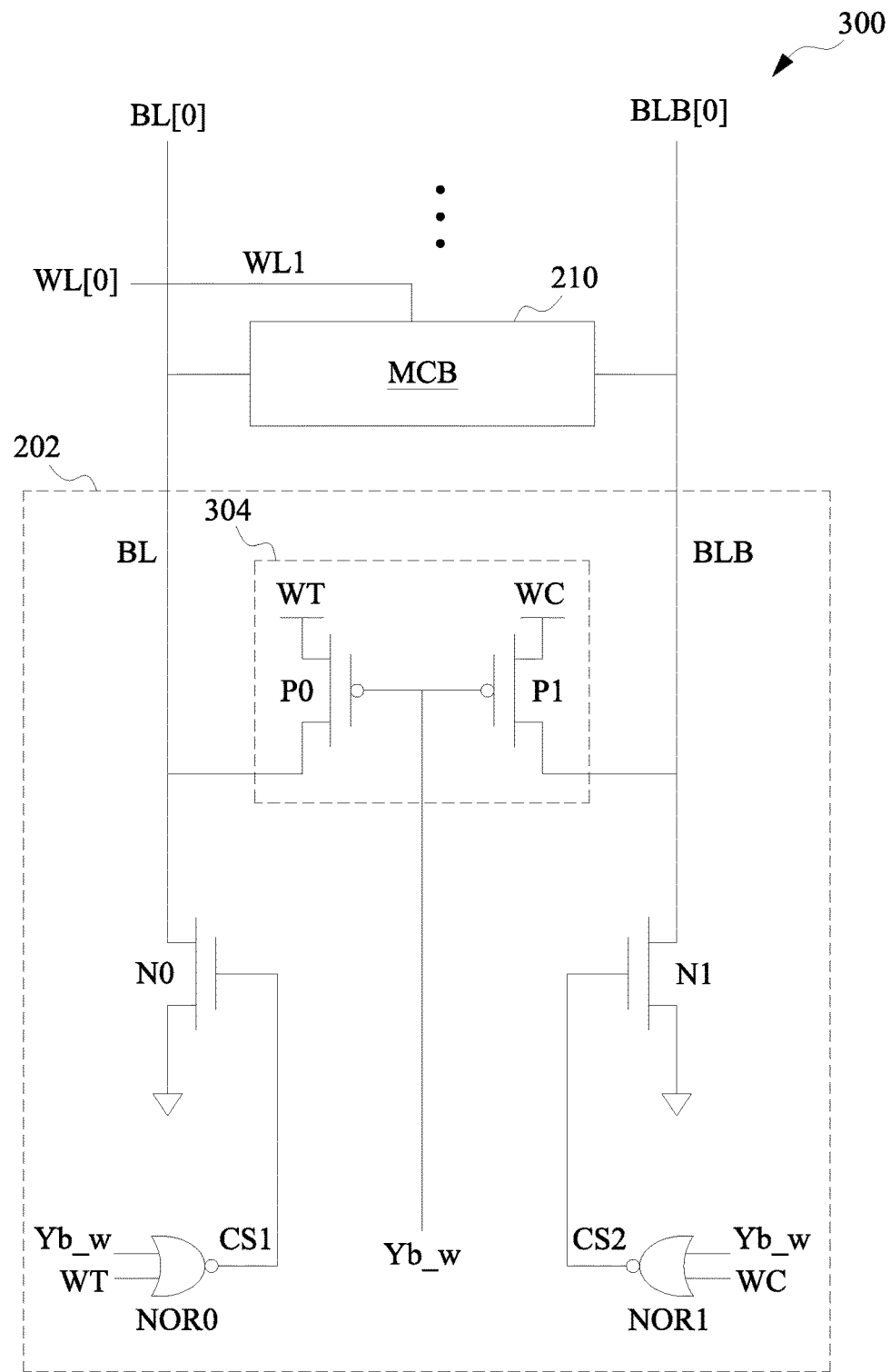
FIG. 3 is a schematic diagram of a driver circuit in a memory circuit in accordance with one or more embodiments.

FIG. 3 is a schematic diagram of a memory circuit 300 in accordance with one or more embodiments. Memory circuit 300 is an embodiment of memory circuit 100 shown in FIG. 1A or an embodiment of memory circuit 100B shown in FIG. 1B. As shown in FIG. 3, analogous elements have the same designations as those shown in FIG. 2A, and detailed description thereof is thus omitted.

In comparison with memory circuit 200 shown in FIG. 2A, memory circuit 300 includes recovery circuit 304 instead of recovery circuit 204.

In comparison with recovery circuit 204 shown in FIG. 2A, recovery circuit 304 is not electrically coupled with the gate terminal of NMOS transistor N0, the output terminal of NOR gate NOR0, the gate terminal of NMOS transistor N1 and the output terminal of NOR gate NOR1.

In comparison with FIG. 2A, the source terminal of PMOS transistor P0 (of FIG. 3) is not electrically coupled with the gate terminal of NMOS transistor N1 and the output terminal of NOR gate NOR1. In comparison with FIG. 2A, the source terminal of PMOS transistor P0 (of FIG. 3) is configured to receive first data signal WT.

In some embodiments, PMOS transistor P0 (of FIG. 3) is configured to selectively adjust the voltage of bit line BL[0] toward a voltage of first data signal WT. In some embodiments, if first data signal WT is a logical high level, PMOS transistor P0 (of FIG. 3) is configured to provide a logical high level to bit line BL[0]. In some embodiments, if first data signal WT is a logical high level and PMOS transistor P0 (of FIG. 3) is activated (e.g., switched-on), PMOS transistor P0 (of FIG. 3) improves the logical high level of bit line BL[0] such that memory circuit 300 recovers from a dummy read, and the high side driving strength of driver circuit 202 of FIG. 3 is improved.

In some embodiments, if first data signal WT is a logical low level, PMOS transistor P0 (of FIG. 3) is configured to provide a logical low level to bit line BL[0]. In some embodiments, if first data signal WT is a logical low level and PMOS transistor P0 (of FIG. 3) is activated (e.g., switched-on), PMOS transistor P0 (of FIG. 3) improves the logical low level of bit line BL[0] such that the low side driving strength of driver circuit 202 of FIG. 3 is improved.

In comparison with FIG. 2A, the source of PMOS transistor P1 (of FIG. 3) is not electrically coupled with the gate terminal of NMOS transistor N0 and the output terminal of NOR gate NOR0. In comparison with FIG. 2A, the source terminal of PMOS transistor P1 (of FIG. 3) is configured to receive second data signal WC.

In some embodiments, PMOS transistor P1 (of FIG. 3) is configured to selectively adjust the voltage of bit line bar BLB[0] toward a voltage of second data signal WC. In some embodiments, if second data signal WC is a logical high level, PMOS transistor P1 (of FIG. 3) is configured to provide a logical high level to bit line bar BLB[0]. In some embodiments, if second data signal WC is a logical high level and PMOS transistor P1 (of FIG. 3) is activated (e.g., switched-on), PMOS transistor P1 (of FIG. 3) improves the logical high level of bit line bar BLB[0] such that memory circuit 300 recovers from a dummy read, and the high side driving strength of driver circuit 202 (shown in FIG. 3) is improved.

In some embodiments, if second data signal WC is a logical low level, PMOS transistor P1 (of FIG. 3) is configured to provide a logical low level to bit line bar BLB[0]. In some embodiments, if second data signal WC is a logical low level and PMOS transistor P1 (of FIG. 3) is activated (e.g., switched-on), PMOS transistor P1 (of FIG. 3) improves the logical low level of bit line bar BLB[0] such that the low side driving strength of driver circuit 202 of FIG. 3 is improved.

Figure 4:
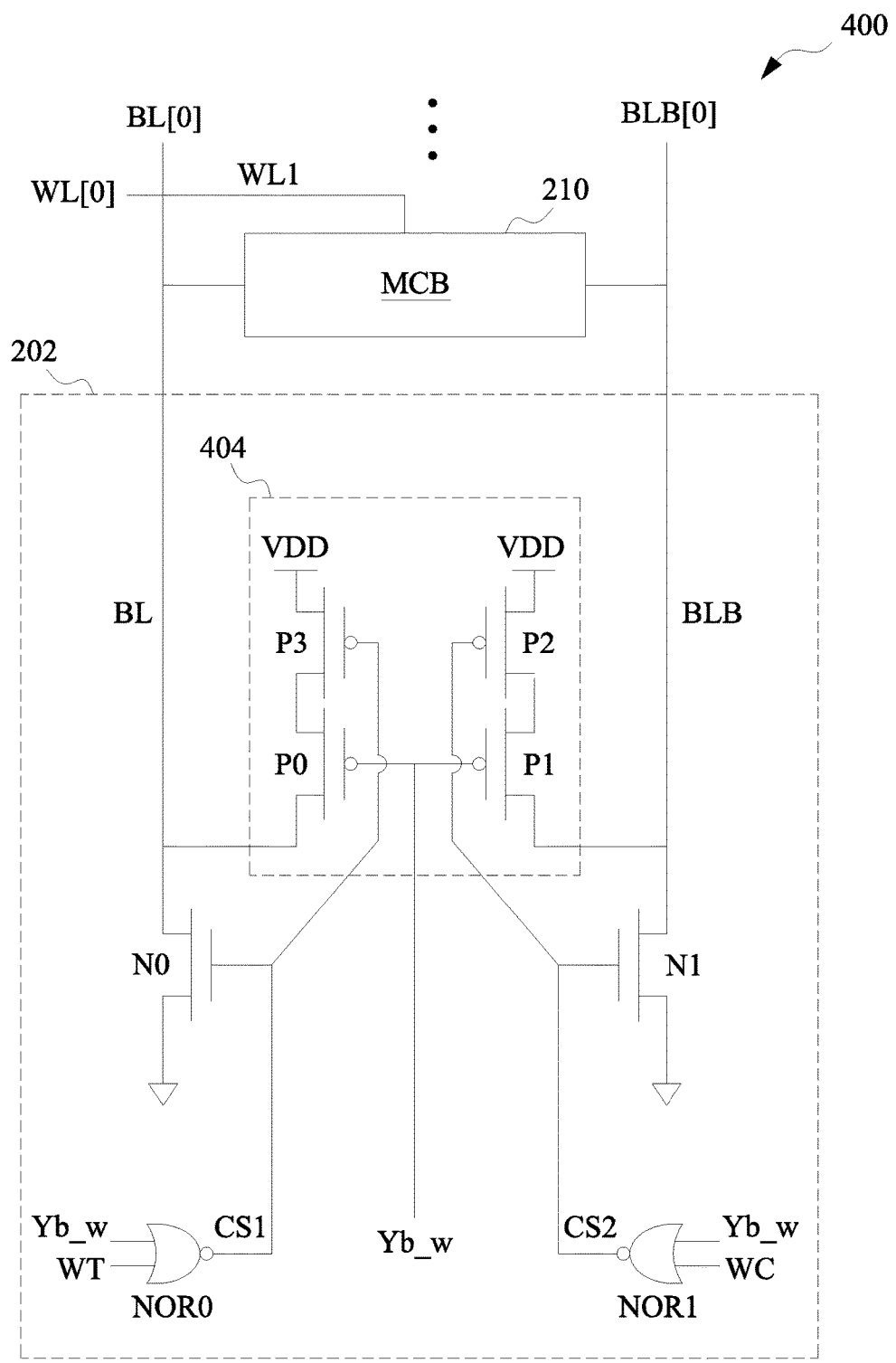
FIG. 4 is a schematic diagram of a driver circuit in a memory circuit in accordance with one or more embodiments.

FIG. 4 is a schematic diagram of a memory circuit 400 in accordance with one or more embodiments. Memory circuit 400 is an embodiment of memory circuit 100A shown in FIG. 1A or an embodiment of memory circuit 100B shown in FIG. 1B. As shown in FIG. 4, analogous elements have the same designations as those shown in FIGS. 2A and 3, and detailed description thereof is thus omitted.

In comparison with memory circuit 200 shown in FIG. 2A, memory circuit 400 includes recovery circuit 404 instead of recovery circuit 204.

Recovery circuit 404 of memory circuit 400 includes four PMOS transistors P0, P1, P2, and P3. In comparison with FIG. 2A, the source terminal of PMOS transistor P0 (of FIG. 4) is not configured to receive second control signal CS2. In comparison with FIG. 2A, the source terminal of PMOS transistor P0 (of FIG. 4) is electrically coupled with the drain terminal of PMOS transistor P3.

In comparison with FIG. 2A, the source terminal of PMOS transistor P1 (of FIG. 4) is not configured to receive first control signal CS1. In comparison with FIG. 2A, the source terminal of PMOS transistor P1 (of FIG. 4) is electrically coupled with the drain terminal of PMOS transistor P2.

A gate terminal of PMOS transistor P2 is electrically coupled with a gate of NMOS transistor N1 and NOR gate NOR1. A source terminal of PMOS transistor P2 is electrically coupled with a power supply voltage (VDD) terminal.

PMOS transistors P1 and P2 (of FIG. 4) are configured to electrically couple bit line bar BLB[0] to power supply voltage (VDD) terminal. PMOS transistors P1 and P2 (of FIG. 4) are configured to control the voltage of bit line bar BLB[0]. In some embodiments, PMOS transistors P1 and P2 (of FIG. 4) are configured to selectively adjust the voltage of bit line bar BLB[0] toward power supply voltage (VDD). In some embodiments, PMOS transistors P1 and P2 (of FIG. 4) are configured to pull the voltage of bit line bar BLB[0] to a logical high level.

The gate terminal of PMOS transistor P2 is configured to receive second control signal CS2. In some embodiments, if second control signal CS2 is a logical low level, PMOS transistor P2 is configured to provide a logical high level to bit line bar BLB[0]. In some embodiments, if second control signal CS2 is a logical low level and PMOS transistor P1 is activated (e.g., switched-on), PMOS transistors P1 and P2 improve the logical high level of bit line bar BLB[0] such that memory circuit 400 recovers from a dummy read, and the high side driving strength of driver circuit 202 shown in FIG. 4 is improved.

A gate terminal of PMOS transistor P3 is electrically coupled with a gate terminal of NMOS transistor N0 and NOR gate NOR0. A source terminal of PMOS transistor P3 is electrically coupled with the power supply voltage (VDD) terminal.

PMOS transistors P0 and P3 (of FIG. 4) are configured to electrically couple bit line BL[0] to power supply voltage (VDD) terminal. PMOS transistors P0 and P3 (of FIG. 4) are configured to control the voltage of bit line BL[0]. In some embodiments, PMOS transistors P0 and P3 (of FIG. 4) are configured to selectively adjust the voltage of bit line BL[0] toward power supply voltage (VDD). In some embodiments, PMOS transistors P0 and P3 (of FIG. 4) are configured to pull the voltage of bit line BL[0] to a logical high level.

The gate terminal of PMOS transistor P3 is configured to receive first control signal CS1. In some embodiments, if first control signal CS1 is a logical low level, PMOS transistor P3 is configured to provide a logical high level to bit line BL[0]. In some embodiments, if first control signal CS1 is a logical low level and PMOS transistor P0 is activated (e.g., switched-on), PMOS transistors P0 and P3 improve the logical high level of bit line BL[0] such that memory circuit 400 recovers from a dummy read and the high side driving strength of driver circuit 202 shown in FIG. 4 is improved.

Figure 5:
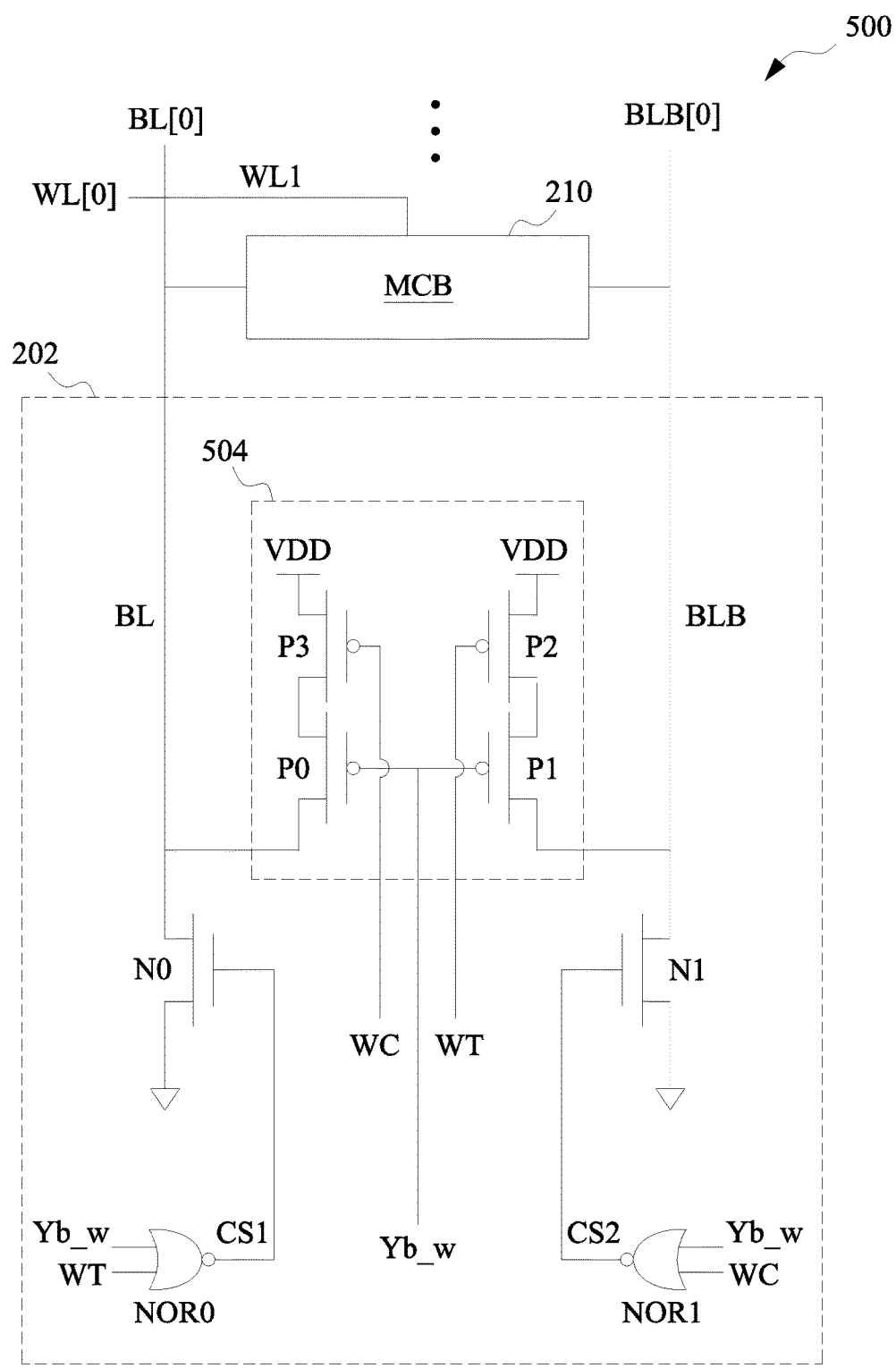
FIG. 5 is a schematic diagram of a driver circuit in a memory circuit in accordance with one or more embodiments.

FIG. 5 is a schematic diagram of a memory circuit 500 in accordance with one or more embodiments. Memory circuit 500 is an embodiment of memory circuit 100A shown in FIG. 1A or an embodiment of memory circuit 100B shown in FIG. 1B. As shown in FIG. 5, analogous elements have the same designations as those shown in FIGS. 2A, 3 and 4, and detailed description thereof is thus omitted.

In comparison with memory circuit 400 shown in FIG. 4, memory circuit 500 includes recovery circuit 504 instead of recovery circuit 404. Recovery circuit 504 is an embodiment of recovery circuit 404 shown in FIG. 4.

In comparison with recovery circuit 404 shown in FIG. 4, recovery circuit 504 is not electrically coupled with the gate terminal of NMOS transistor N0, the output terminal of NOR gate NOR0, the gate terminal of NMOS transistor N1 and the output terminal of NOR gate NOR1.

In comparison with FIG. 4, the gate terminal of PMOS transistor P2 (of FIG. 5) is not electrically coupled with the gate terminal of NMOS transistor N1 and the output terminal of NOR gate NOR1. In comparison with FIG. 4, the gate terminal of PMOS transistor P2 (of FIG. 5) is configured to receive first data signal WT.

In some embodiments, if first data signal WT is a logical low level, PMOS transistor P2 is configured to provide a logical high level to bit line bar BLB[0]. In some embodiments, if first data signal WT is a logical low level and PMOS transistor P1 is activated (e.g., switched-on), PMOS transistors P1 and P2 improve the logical high level of bit line bar BLB[0] such that memory circuit 500 recovers from a dummy read, and the high side driving strength of driver circuit 202 shown in FIG. 5 is improved.

In comparison with FIG. 4, the gate terminal of PMOS transistor P3 (of FIG. 5) is not electrically coupled with the gate terminal of NMOS transistor N0 and the output terminal of NOR gate NOR0. In comparison with FIG. 4, the gate terminal of PMOS transistor P3 (of FIG. 5) is configured to receive second data signal WC.

In some embodiments, if second data signal WC is a logical low level, PMOS transistor P3 is configured to provide a logical high level to bit line BL[0]. In some embodiments, if second data signal WC is a logical low level and PMOS transistor P0 is activated (e.g., switched-on), PMOS transistors P0 and P3 improve the logical high level of bit line BL[0] such that memory circuit 500 recovers from a dummy read, and the high side driving strength of driver circuit 202 shown in FIG. 5 is improved.

Figure 6:
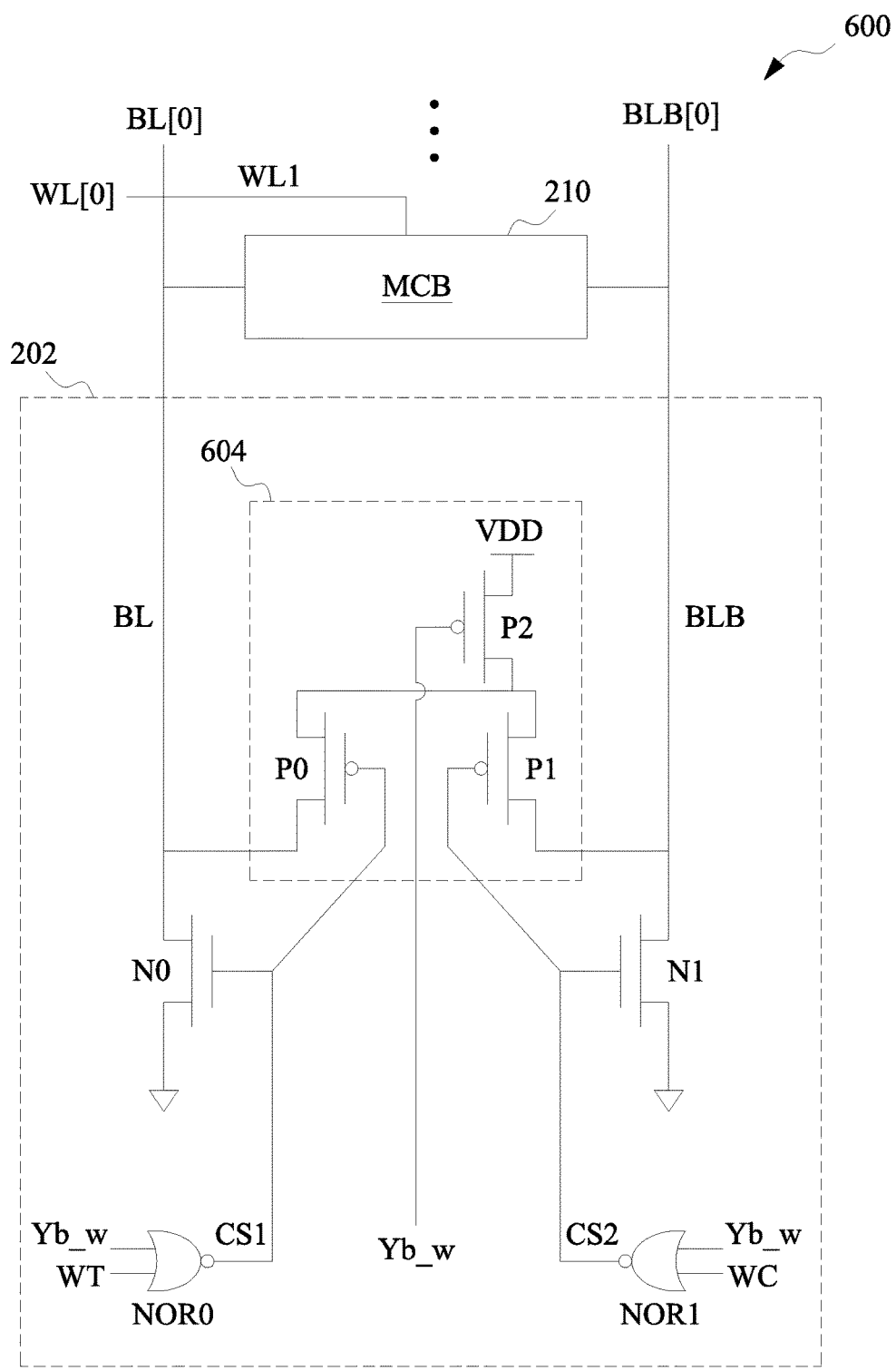
FIG. 6 is a schematic diagram of a driver circuit in a memory circuit in accordance with one or more embodiments.

FIG. 6 is a schematic diagram of a memory circuit 600 in accordance with one or more embodiments. Memory circuit 600 is an embodiment of memory circuit 100A shown in FIG. 1A or an embodiment of memory circuit 100B shown in FIG. 1B. As shown in FIG. 6, analogous elements have the same designations as those shown in FIGS. 2A, 3, 4 and 5.

In comparison with memory circuit 400 shown in FIG. 4, memory circuit 600 includes recovery circuit 604 instead of recovery circuit 404. Recovery circuit 604 is an embodiment of recovery circuit 404 shown in FIG. 4.

In comparison with recovery circuit 404 shown in FIG. 4, recovery circuit 604 does not include PMOS transistor P3.

In comparison with FIG. 4, the gate terminal of PMOS transistor P0 (of FIG. 6) is not electrically coupled with the gate terminal of PMOS transistor P1 and not configured to receive driver control signal Yb_w. In comparison with FIG. 4, the gate terminal of PMOS transistor P0 (of FIG. 6) is electrically coupled with the gate terminal of NMOS transistor N0 and the output terminal of NOR gate NOR0.

In comparison with FIG. 4, the source terminal of PMOS transistor P0 (of FIG. 6) is electrically coupled with the source terminal of PMOS transistor P1 and the drain terminal of PMOS transistor P2.

In comparison with FIG. 4, the gate terminal of PMOS transistor P1 (of FIG. 6) is not electrically coupled with the gate terminal of PMOS transistor P0 and not configured to receive driver control signal Yb_w. In comparison with FIG. 4, the gate terminal of PMOS transistor P0 (of FIG. 6) is electrically coupled with the gate terminal of NMOS transistor N1 and the output terminal of NOR gate NOR1.

In comparison with FIG. 4, the gate terminal of PMOS transistor P2 (of FIG. 6) is configured to receive driver control signal Yb_w.

PMOS transistors P0 and P2 (of FIG. 6) are configured to electrically couple bit line BL[0] to power supply voltage (VDD) terminal. PMOS transistors P0 and P2 (of FIG. 6) are configured to control the voltage of bit line BL[0]. In some embodiments, PMOS transistors P0 and P2 (of FIG. 6) are configured to selectively adjust the voltage of bit line BL[0] toward power supply voltage (VDD). In some embodiments, PMOS transistors P0 and P2 (of FIG. 6) are configured to pull the voltage of bit line BL[0] to a logical high level.

The gate terminal of PMOS transistor P0 (shown in FIG. 6) is configured to receive first control signal CS1. In some embodiments, if first control signal CS1 is a logical low level, PMOS transistor P0 (shown in FIG. 6) is configured to provide a logical high level to bit line BL[0]. In some embodiments, if first control signal CS1 is a logical low level and PMOS transistor P2 is activated (e.g., switched-on), PMOS transistors P0 and P2 improve the logical high level of bit line BL[0] such that memory circuit 600 recovers from a dummy read, and the high side driving strength of driver circuit 202 shown in FIG. 6 is improved.

PMOS transistors P1 and P2 (of FIG. 6) are configured to electrically couple bit line bar BLB[0] to power supply voltage (VDD) terminal. PMOS transistors P1 and P2 (of FIG. 6) are configured to control the voltage of bit line bar BLB[0]. In some embodiments, PMOS transistors P1 and P2 (of FIG. 6) are configured to selectively adjust the voltage of bit line bar BLB[0] toward power supply voltage (VDD). In some embodiments, PMOS transistors P1 and P2 (of FIG. 6) are configured to pull the voltage of bit line bar BLB[0] to a logical high level.

The gate terminal of PMOS transistor P1 (shown in FIG. 6) is configured to receive second control signal CS2. In some embodiments, if second control signal CS2 is a logical low level, PMOS transistor P1 (shown in FIG. 6) is configured to provide a logical high level to bit line bar BLB[0]. In some embodiments, if second control signal CS2 is a logical low level and PMOS transistor P2 is activated (e.g., switched-on), PMOS transistors P1 and P2 improve the logical high level of bit line bar BLB[0] such that memory circuit 600 recovers from a dummy read and the high side driving strength of driver circuit 202 shown in FIG. 6 is improved.

Figure 7:
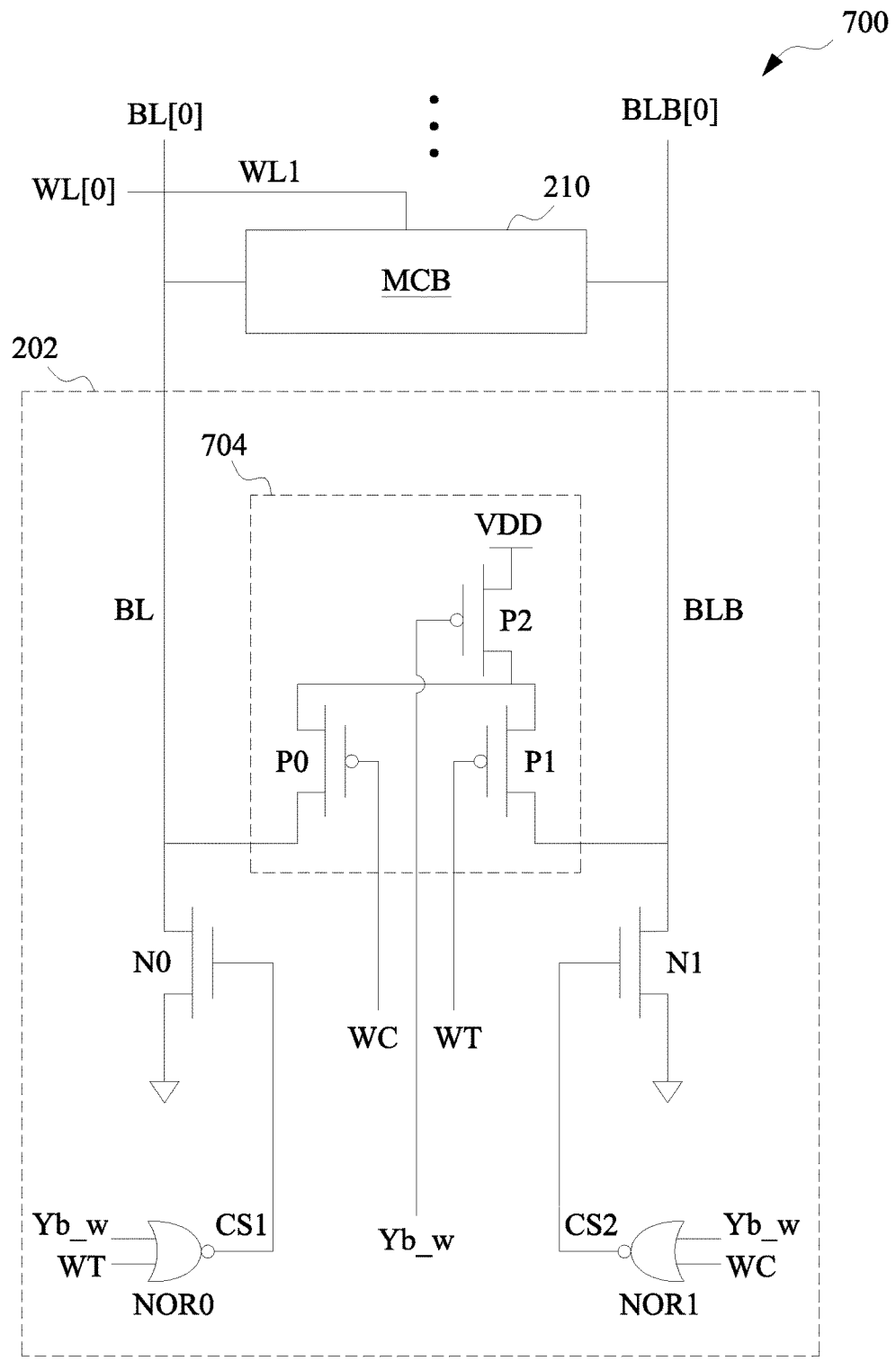
FIG. 7 is a schematic diagram of a driver circuit in a memory circuit in accordance with one or more embodiments.

FIG. 7 is a schematic diagram of a memory circuit 700 in accordance with one or more embodiments. Memory circuit 700 is an embodiment of memory circuit 100A shown in FIG. 1A or an embodiment of memory circuit 100B shown in FIG. 1B. As shown in FIG. 7, analogous elements have the same designations as those shown in FIGS. 2A, 3, 4, 5 and 6.

In comparison with memory circuit 600 shown in FIG. 6, memory circuit 700 includes recovery circuit 704 instead of recovery circuit 604. Recovery circuit 704 is an embodiment of recovery circuit 604 shown in FIG. 6.

In comparison with FIG. 6, the gate terminal of PMOS transistor P0 (of FIG. 7) is not electrically coupled with the gate terminal of NMOS transistor N0 and the output terminal of NOR gate NOR0. In comparison with FIG. 6, the gate terminal of PMOS transistor P0 (of FIG. 7) is configured to receive second data signal WC.

In some embodiments, if second data signal WC is a logical low level, PMOS transistor P0 (shown in FIG. 6) is configured to provide a logical high level to bit line BL[0]. In some embodiments, if second data signal WC is a logical low level and PMOS transistor P2 is activated (e.g., switched-on), PMOS transistors P0 and P2 improve the logical high level of bit line BL[0] such that memory circuit 700 recovers from a dummy read and the high side driving strength of driver circuit 202 shown in FIG. 7 is improved.

In comparison with FIG. 6, the gate terminal of PMOS transistor P1 (of FIG. 7) is not electrically coupled with the gate terminal of NMOS transistor N1 and the output terminal of NOR gate NOR1. In comparison with FIG. 6, the gate terminal of PMOS transistor P1 (of FIG. 7) is configured to receive first data signal WT.

In some embodiments, if first data signal WT is a logical low level, PMOS transistor P1 (shown in FIG. 7) is configured to provide a logical high level to bit line bar BLB[0]. In some embodiments, if first data signal WT is a logical low level and PMOS transistor P2 is activated (e.g., switched-on), PMOS transistors P1 and P2 improve the logical high level of bit line bar BLB[0] such that memory circuit 700 recovers from a dummy read, and the high side driving strength of driver circuit 202 shown in FIG. 7 is improved.

Figure 8:
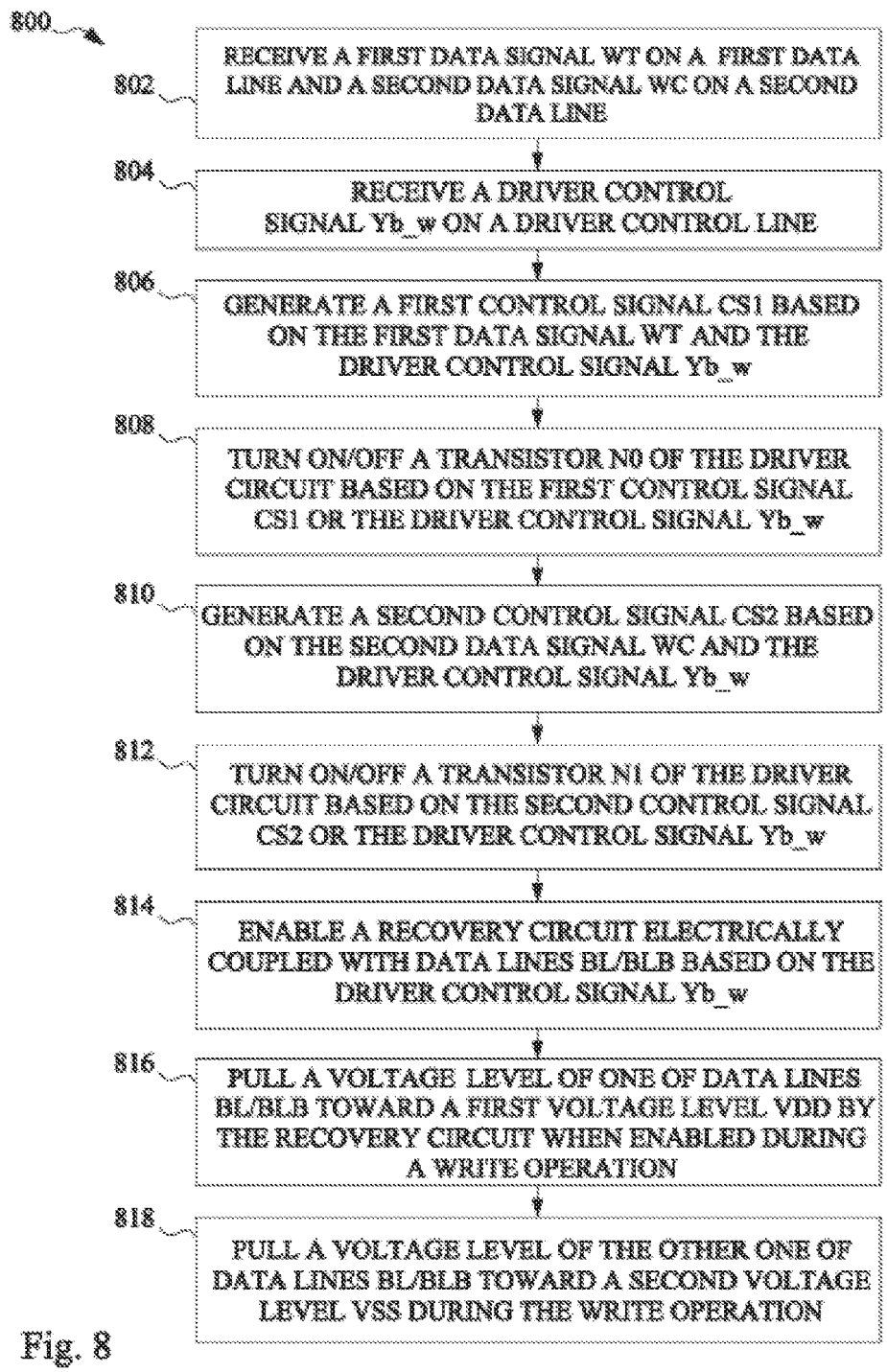
FIG. 8 is a flow chart of a method of operating an SRAM in accordance with some embodiments.

FIG. 8 is a flow chart of a method 800 of operating an SRAM in accordance with some embodiments. In some embodiments, method 800 is usable to operation memory circuit 100A or 100B depicted in FIGS. 1A and 1B and further illustrated in conjunction with FIGS. 2A-7. It is understood that additional operations may be performed before, during, and/or after the method 800 depicted in FIG. 8, and that some other processes may only be briefly described herein.

Method 800 begins with receiving a first data signal WT on a first data line and a second data signal WC on a second data line in operation 802. In some embodiments, during a write operation of memory circuit 100A or 100B, the first data signal WT is inverted from the second data signal WC.

In some embodiments, the first data signal WT corresponds to first data signal WT shown in FIGS. 1, 2A-2B and 3-7. In some embodiments, the second data signal WC corresponds to second data signal WC shown in FIGS. 1, 2A-2B and 3-7.

Method 800 continues with operation 804 in which a driver control signal Yb_w is received on a driver control line. In some embodiments, the first data line and the second data line are electrically coupled with a column of memory cells. In some embodiments, the driver control line corresponds to one of the driver control lines Yb_w[0], . . . Yb_w[N−1] shown in FIG. 1A or the driver control line Yb_w[0] in FIG. 1B. In some embodiments, the driver control signal corresponds to driver control signal Yb_w shown in FIGS. 1, 2A and 3-7.

Method 800 continues with operation 806 in which a first control signal CS1 is generated based on performing a first NOR operation on the first data signal WT with the driver control signal Yb_w. In some embodiments, the first control signal CS1 corresponds to first control signal CS1 shown in FIGS. 2A and 3-7. In some embodiments, the first NOR operation is performed by NOR gate NOR0 (e.g., NOR gate NOR0 shown in FIGS. 2A and 3-7).

Method 800 continues with operation 808 in which a first transistor N0 of the driver circuit is turned on or off based on the first control signal CS1 or the driver control signal Yb_w, which causes the first transistor to function as a short circuit or an open circuit to a data line BL. In some embodiments, the first transistor N0 corresponds to NMOS transistor N0 shown in FIGS. 2A and 3-7. In some embodiments, the data line BL corresponds to bit line BL (e.g., bit line BL[0], . . . BL[N−1] shown in FIG. 1).

Method 800 continues with operation 810 in which a second control signal CS2 is generated based on performing a second NOR operation on the second data signal WC with the driver control signal Yb_w. In some embodiments, the second control signal CS2 corresponds to second control signal CS2 shown in FIGS. 2A and 3-7. In some embodiments, the second NOR operation is performed by NOR gate NOR1 (e.g., NOR gate NOR1 shown in FIGS. 2A and 3-7).

Method 800 continues with operation 812 in which a second transistor N1 of the driver circuit is turned on or off based on the second control signal CS2 or the driver control signal Yb_w, which causes the second transistor N1 to function as an open circuit or a short circuit to a data line BLB. In some embodiments, the second transistor N1 corresponds to NMOS transistor N1 shown in FIGS. 2A and 3-7. In some embodiments, the data line BLB corresponds to bit line bar BLB (e.g., bit line bar BLB shown in FIGS. 1, 2A-2B and 3-7).

Method 800 continues with operation 814 in which a recovery circuit electrically coupled with the driver control line and the data lines BL/BLB is enabled based on the driver control signal Yb_w. In some embodiments, the recovery circuit corresponds to recovery circuit 204, 304, 404, 504, 604, or 704 shown in FIGS. 2A and 3-7. In some embodiments, the recovery circuit of operation 814 is enabled based on the driver control signal Yb_w and either the first data signal WT or the second data signal WC.

Method 800 continues with operation 816 in which one of the data lines BL or BLB is pulled toward a first voltage level by the recovery circuit based on first data signal WT or a second data signal WC when the recovery circuit is enabled during the write operation. In some embodiments, the first voltage level corresponds to a voltage level of a supply voltage VDD.

Method 800 continues with operation 818 in which the other one of the data lines BL or BLB is pulled a second voltage level by the driver circuit based on the first data signal WT or the second data signal WC during the write operation. In some embodiments, the second voltage level corresponds to a voltage level of a reference voltage VSS. In some embodiments, in operation 818, the other one of the data lines BL/BLB is also pulled toward the second voltage level by the recovery circuit based on the first data signal WT or a second data signal WC when the recovery circuit is enabled during the write operation.

In some embodiments, operations are able to be removed or that additional operations are able to be added to method 800 without departing from the scope of this description. In some embodiments, an order of operations in method 800 is able to be adjusted without departing from the scope of this description.

One aspect of this description relates to a static random access memory (SRAM) circuit. The SRAM circuit includes a memory cell array, a first data line, a second data line, a third data line and a driver circuit. The first data line is electrically coupled with the memory cell array. The second data line is electrically coupled with the memory cell array. The driver circuit is electrically coupled with the first data line, the second data line and the third data line. The driver circuit includes a recovery circuit electrically coupled with the first data line, the second data line and the third data line. During a write operation of the SRAM, the recovery circuit is configured to be enabled or disabled responsive to a driver control signal on the driver control signal line, and to pull a voltage level of the first data line or a voltage level of the second data line to a first voltage level when the recovery circuit is enabled.

Another aspect of this description relates to a memory circuit. the memory circuit includes a column of memory cells, a first data line electrically coupled with the column of memory cells, a second data line electrically coupled with the column of memory cells, a first pulling circuit electrically coupled with the first data line, a second pulling circuit electrically coupled with the second data line, and a third pulling circuit electrically coupled with the first data line and the second data line. The first pulling circuit is configured to pull a voltage level of the first data line toward a first voltage level responsive to a first write data signal and a driver control signal during a write operation. The first voltage level corresponds to a first logical value. The second pulling circuit is configured to pull a voltage level of the second data line toward the first voltage level responsive to a second write data signal and the driver control signal during the write operation. The third pulling circuit is configured to be enabled or disabled responsive to the driver control signal, and to pull one of the voltage level of the first data line or the voltage level of the second data line toward the first voltage level responsive to the first data signal or the second data signal when the recovery circuit is enabled during the write operation.

Still another aspect of this description relates to a method of operating a static random access memory (SRAM). The method includes enabling a recovery circuit based on a driver control signal during a write operation. The recovery circuit is electrically coupled with a first data line and a second data line, and the first data line and the second data line are electrically coupled with a column of memory cells. One of the first data line or the second data line is pulled toward a first voltage level by the recovery circuit based on a first data signal or a second data signal when the recovery circuit is enabled during the write operation. The other one of the first data line or the second data line is pulled toward a second voltage level by a driver circuit based on the first data signal or the second data signal during the write operation.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) circuit comprising:
    a memory cell array;
    a first data line electrically coupled with the memory cell array;
    a second data line electrically coupled with the memory cell array;
    a driver control signal line;
    a driver circuit electrically coupled with the first data line, the second data line, and the driver control signal line, wherein the driver circuit comprises:
        a recovery circuit electrically coupled with the first data line, the second data line, and the driver control signal line, the recovery circuit including at least one transistor,
        wherein a gate of the at least one transistor is electrically coupled with the driver control signal line and the recovery circuit is configured to be enabled or disabled responsive to a driver control signal on the driver control signal line, and to pull a voltage level of the first data line or a voltage level of the second data line toward a first voltage level when the recovery circuit is enabled during a first write operation of the SRAM.

2. The SRAM circuit of claim 1, wherein the recovery circuit is configured to pull a voltage level of the other one of the first data line or the second data line to a second voltage level when the recovery circuit is enabled during a second write operation of the SRAM.

3. The SRAM circuit of claim 1, wherein the driver circuit further comprises:
    a first NOR gate,
        a first input terminal of the first NOR gate electrically coupled with the driver control signal line and configured to receive the driver control signal, a second input terminal of the first NOR gate configured to receive a first data signal, and
an output terminal of the first NOR gate configured to output a first write control signal; and
a first N-type transistor,
a first terminal of the first N-type transistor electrically coupled with the output terminal of the first NOR gate,
a second terminal of the first N-type transistor electrically coupled with the first data line, and
a third terminal of the first N-type transistor electrically coupled with a reference voltage node configured to carry a reference voltage.

4. The SRAM circuit of claim 3, wherein the driver circuit further comprises:
a second NOR gate,
a first input terminal of the second NOR gate electrically coupled with the driver control signal line and configured to receive the driver control signal;
a second input terminal of the second NOR gate configured to receive a second data signal, and
an output terminal of the second NOR gate configured to output a second write control signal; and
a second N-type transistor,
a first terminal of the second N-type transistor electrically coupled with the output terminal of the second NOR gate,
a second terminal of the second N-type transistor electrically coupled with the second data line, and
a third terminal of the second N-type transistor electrically coupled with the reference voltage node.

5. The SRAM circuit of claim 4, wherein the recovery circuit comprises:
a first P-type transistor,
a first terminal of the first P-type transistor configured to receive the driver control signal,
a second terminal of the first P-type transistor electrically coupled with the first data line, and
a third terminal of the first P-type transistor electrically coupled with the first terminal of the second N-type transistor and the output terminal of the second NOR gate; and
a second P-type transistor,
a first terminal of the second P-type transistor configured to receive the driver control signal,
a second terminal of the second P-type transistor electrically coupled with the second data line, and
a third terminal of the second P-type transistor electrically coupled with the first terminal of the first N-type transistor and the output terminal of the first NOR gate.

6. The SRAM circuit of claim 4, wherein the recovery circuit comprises:
a first P-type transistor,
a first terminal of the first P-type transistor configured to receive the driver control signal,
a second terminal of the first P-type transistor electrically coupled with the first data line, and
a third terminal of the first P-type transistor configured to receive the first data signal, and
a second P-type transistor,
a first terminal of the second P-type transistor configured to receive the driver control signal,
a second terminal of the second P-type transistor electrically coupled with the second data line, and
a third terminal of the second P-type transistor configured to receive the second data signal.

7. The SRAM circuit of claim 4, wherein the recovery circuit comprises:
a first P-type transistor,
a first terminal of the first P-type transistor configured to receive the driver control signal, and
a second terminal of the first P-type transistor electrically coupled with the first data line;
a second P-type transistor,
a first terminal of the second P-type transistor configured to receive the driver control signal, and
a second terminal of the second P-type transistor electrically coupled with the second data line;
a third P-type transistor,
a first terminal of the third P-type transistor configured to receive the first write control signal,
a second terminal of the third P-type transistor electrically coupled with a third terminal of the first P-type transistor, and
a third terminal of the third P-type transistor electrically coupled with a supply voltage node configured to carry a supply voltage; and
a fourth P-type transistor,
a first terminal of the fourth P-type transistor configured to receive the second write control signal,
a second terminal of the fourth P-type transistor electrically coupled with a third terminal of the second P-type transistor, and
a third terminal of the fourth P-type transistor electrically coupled with the supply voltage node.

8. The SRAM circuit of claim 4, wherein the recovery circuit comprises:
a first P-type transistor,
a first terminal of the first P-type transistor configured to receive the driver control signal, and
a second terminal of the first P-type transistor electrically coupled with the first data line;
a second P-type transistor,
a first terminal of the second P-type transistor configured to receive the driver control signal, and
a second terminal of the second P-type transistor electrically coupled with the second data line;
a third P-type transistor,
a first terminal of the third P-type transistor configured to receive the second data signal,
a second terminal of the third P-type transistor electrically coupled with a third terminal of the first P-type transistor, and
a third terminal of the third P-type transistor electrically coupled with a supply voltage node configured to carry a supply voltage; and
a fourth P-type transistor,
a first terminal of the fourth P-type transistor configured to receive the first data signal,
a second terminal of the fourth P-type transistor electrically coupled with a third terminal of the second P-type transistor, and
a third terminal of the fourth P-type transistor electrically coupled with the supply voltage node.

9. The SRAM circuit of claim 4, wherein the recovery circuit comprises:
a first P-type transistor,
a first terminal of the first P-type transistor configured to receive the first write control signal, and
a second terminal of the first P-type transistor electrically coupled with the first data line;

a second P-type transistor,
  a first terminal of the second P-type transistor configured to receive the second write control signal,
  a second terminal of the second P-type transistor electrically coupled with the second data line, and
  a third terminal of the second P-type transistor electrically coupled with a third terminal of the first P-type transistor; and
a third P-type transistor,
  a first terminal of the third P-type transistor configured to receive the driver control signal,
  a second terminal of the third P-type transistor electrically coupled with the third terminal of the first P-type transistor and the third terminal of the second P-type transistor, and
  a third terminal of the third P-type transistor electrically coupled with a supply voltage node configured to carry a supply voltage.

10. The SRAM circuit of claim 4, wherein the recovery circuit comprises:
a first P-type transistor,
  a first terminal of the first P-type transistor configured to receive the second data signal, and
  a second terminal of the first P-type transistor electrically coupled with the first data line;
a second P-type transistor,
  a first terminal of the second P-type transistor configured to receive the first data signal,
  a second terminal of the second P-type transistor electrically coupled with the second data line, and
  a third terminal of the second P-type transistor electrically coupled with a third terminal of the first P-type transistor; and
a third P-type transistor,
  a first terminal of the third P-type transistor configured to receive the driver control signal,
  a second terminal of the third P-type transistor electrically coupled with the third terminal of the first P-type transistor and the third terminal of the second P-type transistor, and
  a third terminal of the third P-type transistor electrically coupled with a supply voltage node configured to carry a supply voltage.

11. A static random access memory (SRAM) circuit comprising:
a memory cell array;
a first data line electrically coupled with the memory cell array;
a second data line electrically coupled with the memory cell array;
a driver control signal line; and
a driver circuit electrically coupled with the first data line, the second data line, and the driver control signal line, wherein the driver circuit comprises:
  a recovery circuit electrically coupled with the first data line, the second data line, and the driver control signal line,
    wherein the recovery circuit is configured to be enabled or disabled responsive to a driver control signal on the driver control signal line, and to pull a voltage level of the first data line or a voltage level of the second data line toward a first voltage level when the recovery circuit is enabled during a first write operation of the SRAM;
  a first NOR gate,
    a first input terminal of the first NOR gate electrically coupled with the driver control signal line and configured to receive the driver control signal,
    a second input terminal of the first NOR gate configured to receive a first data signal, and
    an output terminal of the first NOR gate configured to output a first write control signal; and
  a first N-type transistor,
    a first terminal of the first N-type transistor electrically coupled with the output terminal of the first NOR gate,
    a second terminal of the first N-type transistor electrically coupled with the first data line, and
    a third terminal of the first N-type transistor electrically coupled with a reference voltage node configured to carry a reference voltage;
  a second NOR gate,
    a first input terminal of the second NOR gate electrically coupled with the driver control signal line and configured to receive the driver control signal;
    a second input terminal of the second NOR gate configured to receive a second data signal, and
    an output terminal of the second NOR gate configured to output a second write control signal; and
  a second N-type transistor,
    a first terminal of the second N-type transistor electrically coupled with the output terminal of the second NOR gate,
    a second terminal of the second N-type transistor electrically coupled with the second data line, and
    a third terminal of the second N-type transistor electrically coupled with the reference voltage node; and
wherein the recovery circuit comprises:
  a first P-type transistor,
    a first terminal of the first P-type transistor configured to receive the driver control signal,
    a second terminal of the first P-type transistor electrically coupled with the first data line, and
    a third terminal of the first P-type transistor electrically coupled with the first terminal of the second N-type transistor and the output terminal of the second NOR gate; and
  a second P-type transistor,
    a first terminal of the second P-type transistor configured to receive the driver control signal,
    a second terminal of the second P-type transistor electrically coupled with the second data line, and
    a third terminal of the second P-type transistor electrically coupled with the first terminal of the first N-type transistor and the output terminal of the first NOR gate.

12. The SRAM circuit of claim 11, wherein the recovery circuit is configured to pull a voltage level of the other one of the first data line or the second data line to a second voltage level when the recovery circuit is enabled during a second write operation of the SRAM.

13. A memory circuit comprising:
a memory cell;
a first data line connected to the memory cell;
a second data line connected to the memory cell;
a column select signal line; and
a driver circuit connected to the first data line, the second data line, and the column select signal line, wherein the driver circuit includes a recovery circuit connected to the first data line, the second data line, and the column select signal line, the recovery circuit including at least one transistor,
wherein a gate of the at least one transistor is connected to the column select signal line and the recovery circuit is configured to be activated as a function of a column select signal on the column select signal line, and to urge a voltage level of the first data line or a voltage level of the second data line toward a first voltage level when the recovery circuit is activated during an operation of the memory circuit.

14. The memory circuit of claim 13, wherein the recovery circuit is configured to urge a voltage level of the other one of the first data line or the second data line toward a second voltage level when the recovery circuit is activated during the operation of the memory circuit.

15. The memory circuit of claim 13, wherein the driver circuit further comprises:
   a first NOR gate,
      a first input terminal of the first NOR gate connected to the column select signal line and configured to receive the column select signal,
      a second input terminal of the first NOR gate configured to receive a first data signal, and
      an output terminal of the first NOR gate configured to output a first write control signal; and
   a first N-type transistor,
      a first terminal of the first N-type transistor connected to the output terminal of the first NOR gate,
      a second terminal of the first N-type transistor connected to the first data line, and
      a third terminal of the first N-type transistor connected to a reference voltage node configured to carry a reference voltage.

16. The memory circuit of claim 15, wherein the driver circuit further comprises:
   a second NOR gate,
      a first input terminal of the second NOR gate connected to the column select signal line and configured to receive the column select signal;
      a second input terminal of the second NOR gate configured to receive a second data signal, and
      an output terminal of the second NOR gate configured to output a second write control signal; and
   a second N-type transistor,
      a first terminal of the second N-type transistor connected to the output terminal of the second NOR gate,
      a second terminal of the second N-type transistor connected to the second data line, and
      a third terminal of the second N-type transistor connected to the reference voltage node.

17. The memory circuit of claim 16, wherein the recovery circuit comprises:
   a first P-type transistor,
      a first terminal of the first P-type transistor configured to receive the column select signal,
      a second terminal of the first P-type transistor connected to the first data line, and
      a third terminal of the first P-type transistor connected to the first terminal of the second N-type transistor and the output terminal of the second NOR gate; and
   a second P-type transistor,
      a first terminal of the second P-type transistor configured to receive the column select signal,
      a second terminal of the second P-type transistor connected to the second data line, and
      a third terminal of the second P-type transistor connected to the first terminal of the first N-type transistor and the output terminal of the first NOR gate.

18. The memory circuit of claim 16, wherein the recovery circuit comprises:
   a first P-type transistor,
      a first terminal of the first P-type transistor configured to receive the column select signal,
      a second terminal of the first P-type transistor connected to the first data line, and
      a third terminal of the first P-type transistor configured to receive the first data signal, and
   a second P-type transistor,
      a first terminal of the second P-type transistor configured to receive the column select signal,
      a second terminal of the second P-type transistor connected to the second data line, and
      a third terminal of the second P-type transistor configured to receive the second data signal.

19. The memory circuit of claim 16, wherein the recovery circuit comprises:
   a first P-type transistor,
      a first terminal of the first P-type transistor configured to receive the column select signal, and
      a second terminal of the first P-type transistor connected to the first data line;
   a second P-type transistor,
      a first terminal of the second P-type transistor configured to receive the column select signal, and
      a second terminal of the second P-type transistor connected to the second data line;
   a third P-type transistor,
      a first terminal of the third P-type transistor configured to receive the first write control signal,
      a second terminal of the third P-type transistor connected to a third terminal of the first P-type transistor, and
      a third terminal of the third P-type transistor connected to a supply voltage node configured to carry a supply voltage; and
   a fourth P-type transistor,
      a first terminal of the fourth P-type transistor configured to receive the second write control signal,
      a second terminal of the fourth P-type transistor connected to a third terminal of the second P-type transistor, and
      a third terminal of the fourth P-type transistor connected to the supply voltage node.

20. The memory circuit of claim 16, wherein the recovery circuit comprises:
   a first P-type transistor,
      a first terminal of the first P-type transistor configured to receive the column select signal, and
      a second terminal of the first P-type transistor connected to the first data line;
   a second P-type transistor,
      a first terminal of the second P-type transistor configured to receive the column select signal, and
      a second terminal of the second P-type transistor connected to the second data line;
   a third P-type transistor,
      a first terminal of the third P-type transistor configured to receive the second data signal,
      a second terminal of the third P-type transistor connected to a third terminal of the first P-type transistor, and
      a third terminal of the third P-type transistor connected to a supply voltage node configured to carry a supply voltage; and
   a fourth P-type transistor,
      a first terminal of the fourth P-type transistor configured to receive the first data signal,
      a second terminal of the fourth P-type transistor connected to a third terminal of the second P-type transistor, and a third terminal of the fourth P-type transistor connected to the supply voltage node.

\* \* \* \* \*